(12) United States Patent
Deleonibus

(10) Patent No.: US 7,566,922 B2
(45) Date of Patent: Jul. 28, 2009

(54) FIELD EFFECT TRANSISTOR WITH SUITABLE SOURCE, DRAIN AND CHANNEL MATERIALS AND INTEGRATED CIRCUIT COMPRISING SAME

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/591,863

(22) PCT Filed: Mar. 25, 2005

(86) PCT No.: PCT/FR2005/000720

§ 371 (c)(1),
(2), (4) Date: Sep. 6, 2006

(87) PCT Pub. No.: WO2005/093812

PCT Pub. Date: Oct. 6, 2005

(65) Prior Publication Data

US 2007/0187728 A1    Aug. 16, 2007

(30) Foreign Application Priority Data

Mar. 25, 2004   (FR)   ................................. 04 03066

(51) Int. Cl.
H01L 29/26   (2006.01)
(52) U.S. Cl. .................. 257/200; 257/E29.081
(58) Field of Classification Search .................. 257/200, 257/E29.081
See application file for complete search history.

(56) References Cited

U.S. PATENT DOCUMENTS 2,918,396 A * 12/1959 Hall .......................... 438/352
4,885,614 A * 12/1989 Furukawa et al. ............. 257/76
4,893,155 A * 1/1990 Ohata ......................... 257/194

(Continued)

FOREIGN PATENT DOCUMENTS

JP        A 61-276265        12/1986

(Continued)

OTHER PUBLICATIONS

Subramanian, V., et al. "A Novel Technique for 3-D Integration: Ge-seeded Laterally Crystallized TFTs." *1997 Symposium on VLSI Technology—Digest of Technical Papers*, pp. 97-98, Jun. 10, 1997.

(Continued)

*Primary Examiner*—Minh-Loan T Tran
*Assistant Examiner*—W. Wendy Kuo
(74) *Attorney, Agent, or Firm*—Oliff & Berridge, PLC

(57) ABSTRACT

The normally on transistor comprises a source, a drain and a channel. The source, drain and channel materials are chosen such that, for a NMOS type transistor, the electronic affinity of the drain material is lower than the electronic affinity of the channel material and the electronic affinity of the source material is higher than the electronic affinity of the channel material. Moreover, the materials are selected such that, for a PMOS type transistor, the upper level of the valence band of the drain material is higher than the upper level of the valence band of the channel material and the upper level of the valence band of the source material is lower than the upper level of the valence band of the channel material.

3 Claims, 2 Drawing Sheets

U.S. PATENT DOCUMENTS

| | | | |
|---|---|---|---|
| 5,166,084 A * | 11/1992 | Pfiester | 438/151 |
| 5,602,439 A * | 2/1997 | Valone | 313/310 |
| 5,801,401 A * | 9/1998 | Forbes | 257/77 |
| 5,986,291 A * | 11/1999 | Currie et al. | 257/194 |
| 6,187,641 B1 | 2/2001 | Rodder et al. | |
| 7,009,200 B2 * | 3/2006 | Tezuka et al. | 257/19 |
| 2001/0020725 A1 | 9/2001 | Okuno et al. | |
| 2003/0011009 A1 * | 1/2003 | Zhang et al. | 257/284 |
| 2004/0014276 A1 | 1/2004 | Murthy et al. | |
| 2006/0043498 A1 * | 3/2006 | Orlowski et al. | 257/396 |

FOREIGN PATENT DOCUMENTS

| | | |
|---|---|---|
| JP | A 63-013379 | 1/1988 |
| JP | A 63-122177 | 5/1988 |
| JP | A 01-112772 | 5/1989 |

OTHER PUBLICATIONS

Lindert, N. et al. "Quasi-Planar FinFETs with Selectively Grown Germanium Raised Source/ Drain." *2001 International SOI Conference Proceedings*, pp. 111-112, Oct. 1, 2001.

* cited by examiner

FIELD EFFECT TRANSISTOR WITH SUITABLE SOURCE, DRAIN AND CHANNEL MATERIALS AND INTEGRATED CIRCUIT COMPRISING SAME

BACKGROUND OF THE INVENTION

The invention relates to a field effect transistor comprising a source, a drain and a channel, respectively formed by source, drain and channel materials, the source, drain and channel materials being selected such that, for a NMOS type transistor, the electronic affinity $X_d$ of the drain material is lower than the electronic affinity $X_c$ of the channel material and such that, for a PMOS type transistor, the upper level $E_d$ of the valence band of the drain material is higher than the upper level $E_c$ of the valence band of the channel material.

STATE OF THE ART

Field effect transistors achieved on a thin film conventionally comprise a source and a drain connected by a channel controlled by a gate electrode. The charge carriers are slowed down by diffusion when passing in the channel on the one hand, and between the source and the channel on the other hand, which limits the switching velocity of the transistor. Typically, to solve this problem, the source and drain zones are strongly doped, which requires a strong activation of the dopants in the source and drain materials. If these materials are semi-conductors, activation of the dopants is limited by the limited chemical solubility of the dopants in the materials.

The use of a silicon channel and a germanium source and/or drain is well known. The document JP63122177, for example, describes a MOS transistor comprising a germanium channel and source and drain electrodes each comprising an N-doped or P-doped germanium layer and silicon layer. The channel can be an N-type or a P-type channel. The document proposes using the transistor in a CMOS circuit.

The document JP63013379 describes a transistor comprising a silicon channel and source and drain electrodes each formed by an N-doped germanium layer deposited on silicon.

The document US2004/0014276 describes NMOS and PMOS transistors each comprising a silicon channel and a germanium source and drain.

The article "Quasi-Planar FinFETs with Selectively Grown Germanium Raised Source/Drain" by Lindert et al. describes a field effect transistor with a fin between the source and drain. The fin forms the channel. The channel is made of silicon and either the source or drain can be made of germanium.

OBJECT OF THE INVENTION

It is one object of the invention to remedy these shortcomings and, in particular, to produce transistors enabling faster operation.

According to the invention, this object is achieved by the appended claims and, in particular, by the fact that, the transistor being of the normally on type, the electronic affinity $X_s$ of the source material of a NMOS transistor NMOS is higher than the electronic affinity $X_c$ of the channel material of said NMOS transistor and the upper level $E_s$ of the valence band of the source material of a PMOS transistor is lower than the upper level $E_c$ of the valence band of the channel material of said PMOS transistor.

It is a further object of the invention to provide an integrated circuit comprising PMOS and NMOS type field effect transistors according to the invention.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
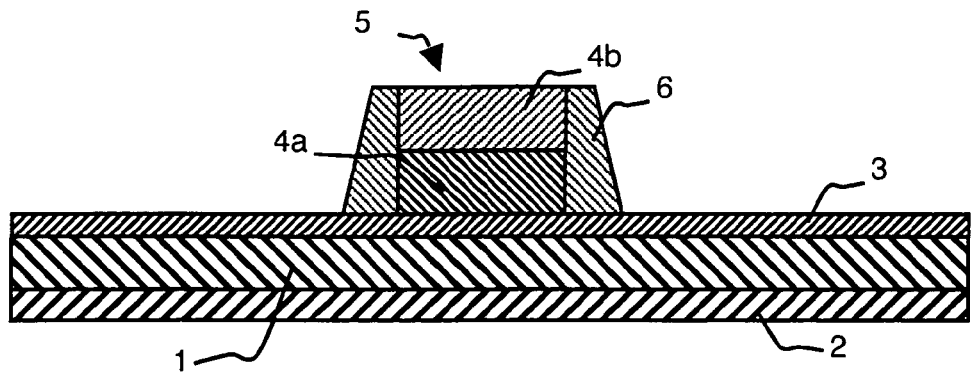
FIGS. 1 to 5 illustrate a particular embodiment of a method for producing a transistor according to the invention.

The transistors according to the invention each comprise a channel made of a predefined material, for example silicon (Si), germanium (Ge), diamond-like carbon (diamond-like C), gallium arsenide (GaAs) or indium antimonide (InSb).

According to the invention, the source and drain materials of NMOS transistors are selected according to their electronic affinities $X_s$ and $X_d$, whereas for PMOS transistors, the source and drain materials are selected according to their upper levels $E_s$ and $E_d$ of the valence band.

The drain material of a NMOS transistor is selected such that the electronic affinity $X_d$ of the drain material is lower than the electronic affinity $X_c$ of the channel material of said NMOS transistor ($X_d < X_c$). The drain material of a PMOS transistor is selected such that the drain material has an upper level $E_d$ of the valence band that is higher than the upper level $E_c$ of the valence band of the channel material of said PMOS transistor ($E_d > E_c$).

NMOS and PMOS transistors can be transistors of the normally on type or of the normally off type. In both cases (on and off), the drain material is chosen applying the rules set out above respectively to NMOS and PMOS transistors. For the source material, another material than that of the channel is selected. In the following, for the choice of source material, we will limit ourselves to normally on transistors.

For normally on transistors, the source material of a NMOS transistor is selected such that the electronic affinity $X_s(on)$ of the source material is higher than the electronic affinity $X_c(on)$ of the channel material of said NMOS transistor ($X_s(on) > X_c(on)$). The upper level $E_s(on)$ of the valence band of the source material of a normally on PMOS transistor is lower than the upper level $E_c(on)$ of the valence band of the channel material of said PMOS transistor ($E_s(on) < E_c(on)$).

These rules enable the drain and source materials to be selected such as to suit the channel material so as to give the transistor better performances. In particular, by choosing a suitable source material different from that of the channel, the velocity of the charge carriers in the channel is then automatically higher than the reference drift velocity which is the velocity obtained if the source material is of the same chemical nature as the channel material but strongly doped of opposite type. Moreover, the velocity of the charge carriers in the source is higher than the velocity of the carriers in the channel. The drain material is different from the channel material and the source material is different from the channel material. The materials source and drain are also different from one another.

Table 1 indicates, in electronvolts, the electronic affinity X and the upper level E of the valence band of different materials able to be used to produce field effect transistors.

TABLE 1

| Material | Electronic affinity X | Upper level E of the valence band |
|---|---|---|
| Si | −4.05 | −5.17 |
| Ge | −4.13 | −4.79 |
| GaAs | −4.07 | −5.49 |
| Diamond-like C | 0 | −5.47 |
| InSb | −4.59 | −4.75 |

For NMOS transistors, when the channel is for example made of silicon (electronic affinity X of −4.05 eV), the drain can for example be made of germanium (X=−4.13 eV), of gallium arsenide (X=−4.07 eV) or of indium antimonide (X=−4.59 eV). In all cases, the electronic affinity Xd of the drain material is thus lower than the electronic affinity Xc of the channel material (Xd<Xc). For a normally on NMOS transistor, the channel being made of silicon, the source can for example be made of diamond-like carbon (electronic affinity X of 0 eV). Thus, the electronic affinity Xs(on) of the source material is higher than the electronic affinity Xc(on) of the channel material (Xs(on)>Xc(on)).

Table 2 indicates different preferential combinations of source and drain materials for a given channel material of a normally on NMOS transistor.

TABLE 2

| Channel material | N source material | N drain material |
|---|---|---|
| Si | Diamond-like C | Ge, GaAs, InSb |
| Ge | Si, GaAs, Diamond-like C | InSb |
| GaAs | Diamond-like C, Si | Ge, InSb |
| Diamond-like C | — | Si, Ge, GaAs, InSb |
| InSb | Si, Ge, GaAs, Diamond-like C | — |

For PMOS transistors, when the channel is for example made of silicon (upper level E of the valence band of −5.17 eV), the drain can for example be made of germanium (E=−4.79 eV) or of indium antimonide (E=−4.75 eV). In all cases, the upper level Ed of the valence band of the drain material is thus higher than that (Ec) of the channel material (Ed>Ec). For a normally on PMOS transistor, the channel being made of silicon, the source can for example be made of gallium arsenide (E=−5.49 eV) or diamond-like carbon (E=−5.47 eV), which corresponds to the condition Es(on)<Ec(on).

Table 3 indicates different preferential combinations of source and drain materials for a given channel material of a normally on PMOS transistor.

TABLE 3

| Channel material | P source material | P drain material |
|---|---|---|
| Si | GaAs, Diamond-like C | Ge, InSb |
| Ge | Si, GaAs, Diamond-like C | InSb |
| GaAs | — | Si, Ge, Diamond-like C, InSb |
| Diamond-like C | GaAs | Si, Ge, InSb |
| InSb | Si, Ge, GaAs, Diamond-like C | — |

The invention is not limited to the combinations of materials indicated above, but applies whatever the materials liable to form a channel, a source or a drain of a field effect transistor, provided that the two above-mentioned conditions are fulfilled. The source and drain materials can also be doped or not to further improve the performances of the transistor.

In a particular embodiment of a method for producing a transistor according to the invention, a first layer 1 designed to form the channel is deposited on a substrate 2, as represented in FIG. 1. The substrate can comprise an insulating thin layer on its surface, for example a layer of oxide having a high dielectric constant, for example alumina. Then a gate insulating layer 3 is deposited on the first layer 1. A conducting layer 4 is then deposited on the gate insulating layer 3. As represented in FIG. 1, the conducting layer 4 can be formed by superposition of a first conducting layer 4a and of a second layer 4b that can be conducting or not, which layer can be used as masking layer for etching. The conducting layer 4a can be deposited by low-pressure chemical vapor deposition or by epitaxy. An etching step enables the conducting layer 4 to be laterally delineated by means of a mask (not shown) so as to form the gate electrode 5. Then deposition of an insulating material on the flanks of the gate electrode 5 enables a lateral insulator 6 of the gate electrode 5 to be formed. The lateral electrical insulator 6 can be achieved by depositing a layer having a thickness corresponding to the thickness of the conducting layer 4 around the gate electrode 5, followed by etching by means of a mask (not shown)

Figure 2:
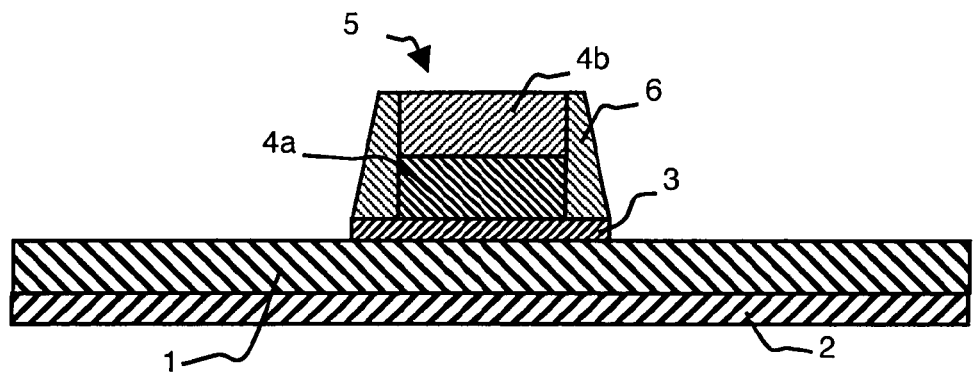

In FIG. 2 etching of the gate insulating layer 3 in the zones of the substrate 2 not covered by the gate electrode 5 and the insulator 6 is represented. This etching can be performed using chlorinated mixtures and a hot cathode type technique.

Figure 3:
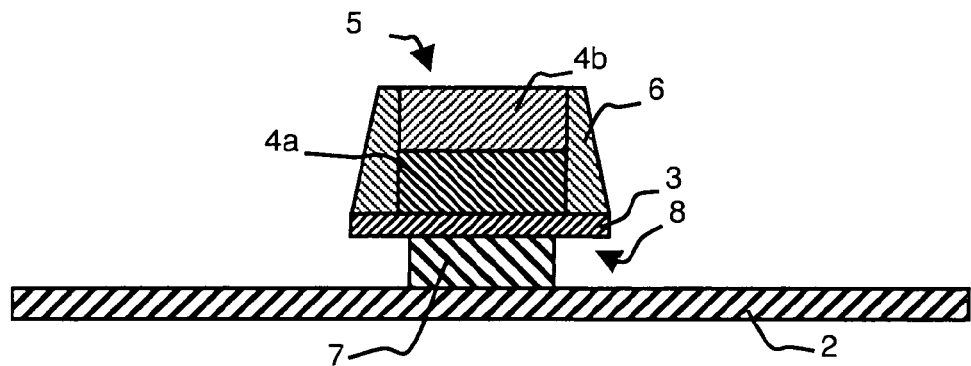

Etching of the first layer 1, represented in FIG. 3, enables the channel 7 to be delineated laterally. The first layer can be etched by anisotropic or isotropic etching, as represented in FIG. 3. By isotropic etching, a removal 8 of the first layer is obtained underneath the gate insulating layer 3, preferably creating a retraction extending up to underneath the gate electrode 5. Anisotropic etching can be performed by reactive ion etching.

Figure 4:
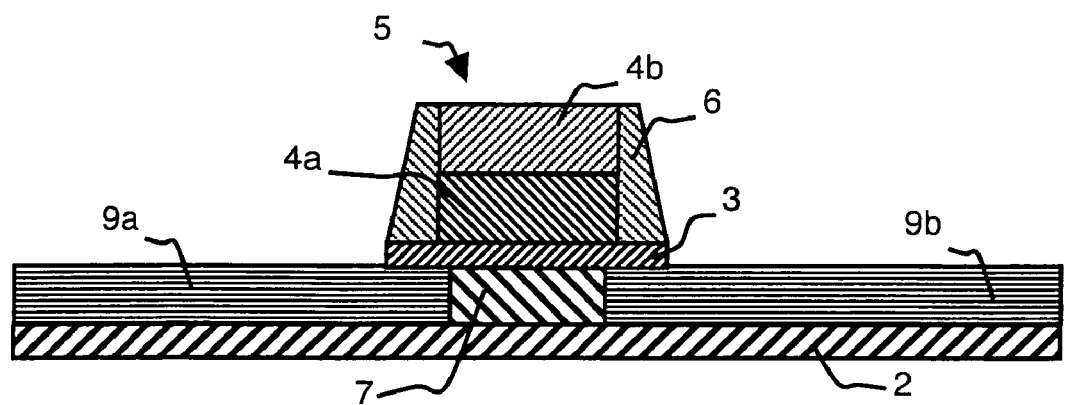

FIG. 4 represents deposition, for example by epitaxy on the substrate 2 on each side of the channel 7, of a source material 9a and a drain material 9b designed to respectively form the source and drain.

Figure 5:
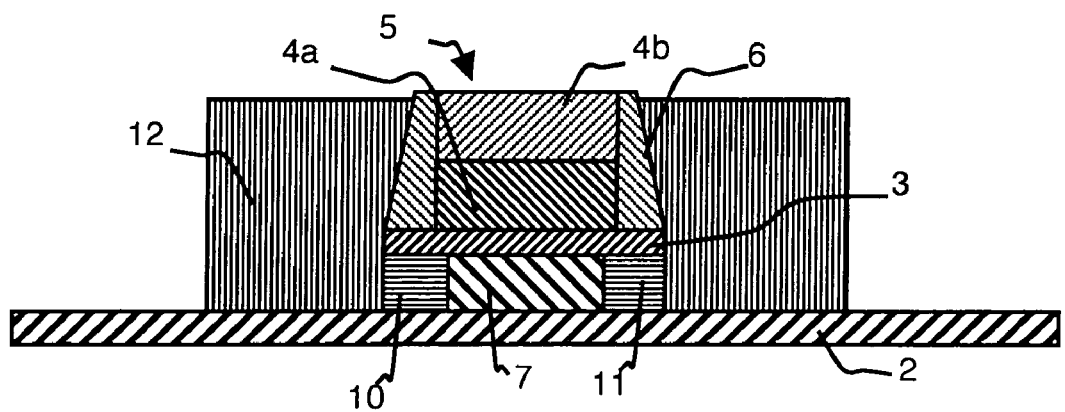

Anisotropic etching of the source material 9a and drain material 9b in the zones of the substrate 2 that are not covered by the gate electrode and the lateral insulator 6 enables the source material 9a and drain material 9b to be delineated laterally and the source 10 and drain 11 to be formed, as represented in FIG. 5. Etching of the semi-conducting material in particular enables a transistor of small size to be obtained. Fabrication of the transistor is completed by formation of contact elements connected to the source 10 and drain 11, by deposition of a metal 12 on the substrate, planarization, for example by mechanical-chemical means, and etching of the metal 12.

When the source 10 and drain 11 of a transistor are formed by different materials, the method for producing the transistor preferably comprises deposition of a first mask on the substrate, at the place where the drain 11 is to be located, and deposition of the source material 9a on the substrate. The first mask can for example be a mineral mask made of silica (SiO$_2$), deposited by chemical vapor deposition. Deposition of the source material 9a can be performed by epitaxy. Then the first mask is removed, for example by means of a hydrofluoric acid solution (HF), and a second mask, for example made of silica, is deposited on the source material 9a. Then the drain material 9b is deposited, for example by epitaxy, and the second mask is removed. The materials 9a and 9b can then be etched anisotropically to respectively delineate the source 10 and drain 11, as previously. The transistor thus obtained can be coated with a thick layer of silica, in which the contacts are formed.

The invention applies more particularly to production of an integrated circuit preferably comprising PMOS type field effect transistors and NMOS type transistors according to the invention.

The invention claimed is:

1. A normally on NMOS field effect transistor comprising:
a source formed by a source material,
a drain formed by a drain material, and
a channel formed by a channel material,
the source, the drain and the channel materials being selected such that:
an electronic affinity of the drain material is lower than an electronic affinity of the channel material,
an electronic affinity of the source material is higher than the electronic affinity of the channel material, and
the source material is different from the drain material, the source material and drain materials having at least one unshared element.

2. A normally on PMOS field effect transistor comprising:
a source formed by a source material,
a drain formed by a drain material, and
a channel formed by a channel material,
the source, the drain and the channel materials being selected such that:
an upper level of a valence band of the drain material is higher than an upper level of a valence band of the channel material,
an upper level of a valence band of the source material is lower than the upper level of the valence band of the channel material, and
the source material is different from the drain material the source material and drain materials having at least one unshared element.

3. An integrated circuit, comprising:
normally on PMOS type; and
normally on NMOS type field effect transistors, wherein:
the normally on NMOS field effect transistor comprises:
an NMOS source formed by an NMOS source material,
an MMOS drain formed by an NMOS drain material, and
an NMOS channel formed by an NMOS channel material,
the NMOS source, NMOS drain and NMOS channel materials being selected such that:
an electronic affinity of the NMOS drain material is lower than an electronic affinity of the NMOS channel material,
an electronic affinity of the NMOS source material is higher than the electronic affinity of the NMOS channel material, and
the NMOS source material is different from the NMOS drain material, the NMOS source material and the NMOS drain material having at least one unshared element; and
the normally on PMOS field effect transistor comprising:
a PMOS source formed by a PMOS source material,
a PMOS drain formed by a PMOS drain material, and
a PMOS channel formed by a PMOS channel material,
the PMOS source, the PMOS drain and the PMOS channel materials being selected such that:
an upper level of a valence band of the PMOS drain material is higher than an upper level of a valence band of the PMOS channel material,
an upper level of a valence band of the PMOS source material is lower than the upper level of the valence band of the PMOS channel material, and
the PMOS source material is different from the PMOS drain material, the PMOS source and the PMOS drain material having at least one unshared element.

\* \* \* \* \*